Feb. 19, 1963 J. G. BLACK, JR 3,078,335

WAFERS FOR MODULAR CONSTRUCTIONS

Filed Nov. 23, 1960

INVENTOR.
James G. Black, Jr.
BY
ATT'Y.

United States Patent Office 3,078,335 Patented Feb. 19, 1963

3,078,335
WAFERS FOR MODULAR CONSTRUCTIONS

James G. Black, Jr., Springfield, Va., assignor to Illinois Tool Works Inc., a corporation of Delaware Filed Nov. 23, 1960, Ser. No. 71,302
3 Claims. (Cl. 174—138)

This invention relates to wafers for modular constructions, and more particularly relates to thin ceramic wafers capable of being asymmetrically indexed for automatic handling thereof.

In the electrical art, and particularly in electronic apparatus, module assemblies are often provided and usually include ceramic wafer elements made of for example steatite, the wafer elements being generally square, flat and substantially uniform in peripheral dimension and thickness. The marginal edges of the wafers are provided with a plurality of V-shaped notches which are generally equally spaced, and the prior art wafers include one additional U-shaped or V-shaped orientation notch, recess or keyway located symmetrically and centrally between two of the V-shaped notches. These orientation notches and orientating feeder therefor are described in my previous patent application filed October 31, 1955 which issued as a United States Patent on November 24, 1959 and is identified as United States Patent No. 2,914,161. The instant application is concerned with improvements in the orienting feeder which is specifically adapted to handle very small sizes of wafers, as well as the wafer per se, and its associated orienting element.

The structure in the above described patent has operated very well for accomplishing orientation of larger size wafers where the wafer size is three quarters of an inch in size or greater. However, with increasing demands for miniaturization of electronic components, new wafer designs and orientation techniques must be provided to handle these smaller size components. In the smaller wafer components (under ¾ of an inch) there is a necessity for (*a*) maximum utilization of the surface area for circuitry, (*b*) a maximum (or limited) number of symmetrical V-shaped notches in the side edges of the wafer for riser wires to interconnect a plurality of wafers, (*c*) maximum dielectric distance between riser wire notches, (*d*) maximum structural integrity consistent with the above, and (*e*) an orienting configuration which does not interfere with the above requirements. Thus, an orientation notch on the side edge which for obvious reasons must be of a substantial larger dimension than riser notches to permit wafer orientation, becomes undesirable because of the reduction in the mechanical strength of the wafer, the extreme tightness of tolerances required, and the poor use of the total marginal edge space consistent with the maximum number of notches which must be symmetrically arranged on the side edges for later modular assembly techniques. Stated another way, if a U-shaped orientation notch, (of the prior art), of larger size than the V-shaped riser notches, is placed on a side edge for orientation purposes, the consequent increase of spacing between adjacent V-shaped riser notches must be increased so that there is sufficient mechanical strength in the wafer, and since the wafer must be adapted for later modular assembly, all V-shaped riser notches must be symmetrically arranged and hence the wafer must be increased in size.

I have overcome these problems by utilization of the corner areas of the essentially square wafers for orientation purposes. The corner areas of the wafers, taught by the prior art, were essentially square neglecting the very slight radius at the corners which is put in for obvious production reasons. Heretofore, the corner areas of the wafers had no particular utility per se. By the particular relief of the corners taught by the instant application, the structural integrity of the wafer is maintained, the spacing of the V-shaped notches in the side edges are at minimum dimensions, and the wafer is well adapted to be oriented by an automatic means which will be later described.

It is thus a general object of this invention to provide a new configuration for a dielectric wafer construction of the above described general type and means for utilizing this configuration for orientation.

Another object of this invention is to provide a new configuration of orienting means on a wafer which is particularly adapted for small sizes of wafers where space is at a premium, which maintains the desired electrical spacing of the riser wires, and maintains the mechanical strength of the wafer.

Another object of this invention is to provide a high speed positive orienting means which will effect orientation of the above discussed wafer in only one of its eight possible positions as it is fed through an orienting device.

It is a further object of this invention to provide a vibratory type compact mechanism for orienting wafers as above described which is utilizable as an attachment to an assembling apparatus for the wafers of the claimed construction.

The novel features that are characteristic of the invention are set forth particularly in the appended claims. The invention, itself, however, both as to its organization and its method of operation, together with additional objects and advantages thereof will best be understood by the following description of a specific embodiment when read in connection with the accompanying drawings, in which:

Figures 1, 2, 3, 4, 5, 6, 7, 8:
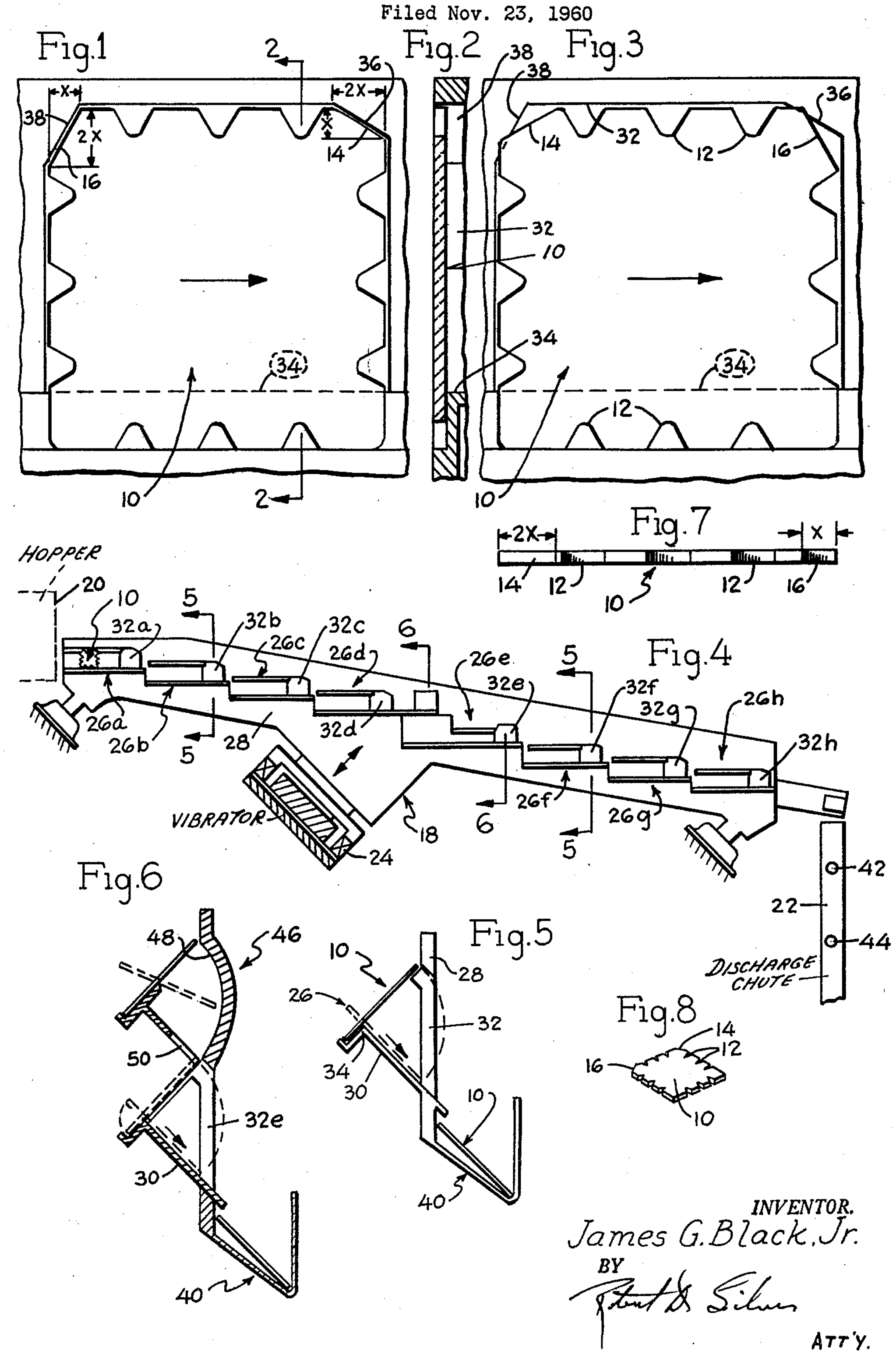
FIGURE 1 is a front elevational view of the novel wafer aligned with a complementary aperture in the orienting mechanism, the arrow on the wafer indicating the direction of movement thereof in the orienting mechanism.
FIGURE 2 is a sectional view along line 2—2 of FIGURE 1.
FIGURE 3 is a view similar to FIGURE 1 showing a wafer and an orienting aperture in misalignments, the arrow on the wafer indicating the direction of movement thereof in the orienting mechanism.
FIGURE 4 is a view of the wafer orienting mechanism, somewhat semidiagrammatic in form.
FIGURE 5 is a view taken along line 5—5 of FIGURE 4.
FIGURE 6 is a sectional view through the inversion station taken approximately along line 6—6 of FIGURE 4.
FIGURE 7 is an end view of the wafer illustrating the dimensions of the relieved corners.
FIGURE 8 is a perspective view of the novel wafer.

As shown in FIGURES 7, 8 and 1 the novel wafer 10 is essentially thin, flat, and of essentially square configuration. The wafers 10 are generally formed of ceramic material, such as from steatite. The side edges of the wafer are normally formed with a plurality of V-shaped notches 12 in symmetrical arrangement around the periphery of the wafer as shown. For purposes of orienting the wafer by mechanical means in accordance with the present invention, the corners 14 and 16 which are terminal portions of one side edge of the wafers are asymmetrically relieved such that only one position of the eight possible positions that a wafer may assume becomes the orienting position. The wafers are adapted to be later printed with circuitry on the two major faces thereof, and a single oriented position of the wafer affords utilization of both sides of the wafer with different circuit configurations. The particular corner relief that I have found to be most suitable, is to remove a right triangular portion of each corner, the short leg of the triangle being of a dimension X and the long leg of the triangle being 2X. The same amount of material is relieved from each of the corners 14 and 16, but in a sense the entire triangular relief has been rotated 90°. Thus, along one edge (the top) as viewed in FIGURES 1 and 3, the relieved corner portions have a total dimension of 3X, whereas the left hand side edge of the wafer, as viewed in FIGURE 1, has been relieved along the corner by a dimension 2X and the right hand side of the wafer, as shown in FIGURE 1, has a relief that extends along the right hand side edge of a dimension X.

The orienting apparatus 18 usable with the above described wafer, may be mounted on any suitable supporting frame, the support for the instant apparatus 18 being shown semidiagrammatically. The orienting apparatus 18 is adapted to take a plurality of random oriented wafers from a heterogeneous mass of wafers in a hopper 20 (shown semidiagrammatically) of any suitable type, march the wafers through the apparatus so as to orient the wafers in a single one of their eight possibe positions and deliver the oriented wafers to a discharge pickup chute 22 at the other end of the apparatus. The power for causing movement of the wafers 10 along the orienting apparatus is provided by a vibrating mechanism 24 of any suitable well-known type.

The basic part of the orienting feeder 18 comprises a vibrating frame member 28 which has orienting troughs and a reversing mechanism. The central vibrating frame member 28 is elongate in nature and preferably made of relative heavy plate which is resiliently suspended in a vertical plane with its length inclined at an angle downwardly from the horizontal. A plurality of suitable track means *26a–26h*, which are canted at an angle from vertical, are mounted on the side of the central 28 as best shown in FIGURE 5. Since the wafer is essentially rectilinear in configuration, it has eight possible positions and eight separate stations are provided. At each station is an aperture or window means *32a–32h* of generally complementary shape to the wafer to allow a properly oriented wafer 10 to fall therethrough. The window 32 is slightly wider than a wafer 10 and the top of the window extends slightly higher than the heighth of a wafer resting on the track means. The track means 26 is provided with an angular portion 30 and a transverse end portion 34 which serves as a support for a non-oriented wafer. It will be noted that the vertical height of end portion 34 is such that in a sense, it covers a lower part of a window and thus serves the function of providing an abutment edge to provide a fulcrum for pivotal movement of an oriented wafer through the window. This is illustrated schematically in FIGURE 5. As viewed in FIGURE 4, the wafers pass along the tracks from window station *32a* down through *32h* until they become correctly aligned with an aperture or window in the manner shown in FIGURE 1 whereupon they fall through plate 28 onto the wafer track for oriented wafers 40 for ultimate discharge into chute 22.

It will be noted that the upper corners of the window *32a–32h* are asymmetrically relieved at 36 and 38 in a manner complementary to the position of the wafer as shown in FIGURE 1. The individual stations *32a* and *32h* are arranged in a manner such that when a wafer passes by a window it will rotate 90° by going over the step between adjacent tracks 26. An inversion station 46 is provided between station *26d* and *26e*. This inversion station 46 is best shown in FIGURE 6, and comprises an enlarged aperture 48 which causes all wafers passing thereby to fall therewithin so as to be discharged in a 180° inverted position through the second aperture 50 at the bottom of the inversion station. The wafers then continue down through stations 26e through 26h until they fall through the appropriate window which indicates by said passing that the wafer has been oriented.

As best shown in FIGURE 3, a non-oriented wafer (for purposes of illustration only) is in the position of being 180° rotated from left to right as compared to the wafer position shown in FIGURE 1. This wafer will pass by the window 32 without falling therethrough and is always supported in such a manner that it cannot jam. More particularly the relieved leading edge adjacent to the top of the wafer, engages the margin of the window adjacent to the corner 36 prior to the trailing wafer edge at 14 leaving the margin of the window adjacent to corner 38. This, of course, is also true of the wafer when it is in any of the other six remaining non-oriented positions relative to the window 32.

In some instances it is desirable to have the vibrating mechanism 24 which powers the orienting feeder mechanism automatically actuated in terms of desired output of the feeder. To this end the discharge chute 22 may be provided with electric photo cell means 42 and 44 which are connected in the circuit with the vibrator mechanism 24.

From the foregoing description it will be apparent that a novel method of configuring a wafer and an orientation means therefore have been provided which are particularly well adapted for use with small sized wafers. Although a specific embodiment has been shown and described, it is with full awareness that many modifications thereof are possible. The invention, therefore, is not to be restricted except insofar as necessitated by the prior art and by the spirit of the appended claims.

What is claimed as the invention is:

1. A small ceramic wafer for use in electrical assemblies of modular construction characterized as being of generally square configuration, said wafer having essentially the same height and length of a dimension under three-quarters of an inch, said wafer having a very small thickness dimension, each of the side edges of said wafer being formed with a plurality of notches symmetrically disposed intermediate the corners of said wafer in identically predetermined spaced relationship to each other and to said corners, at least two corners of said wafer adjacent to one side edge being relieved in an asymmetrical manner to provide means for positive orientation thereof, the relieved areas each being generally of triangular configuration to provide a wafer body having first and second sharply divergent marginal surfaces on the corners adjacent said one side edge, the dimensions of the relieved corner areas as measured in the plane of said one side edge being less than said predetermined spacing of said notches.

2. The wafer set forth in claim 1 wherein the relieved areas are in the form of right triangular configurations, the length of the short leg of each triangle being substantially equal to one-half of the length of the long leg.

3. The wafer set forth in claim 2 wherein one short leg and one long leg from the respective triangles are disposed in the same plane at the respective corners.

References Cited in the file of this patent

UNITED STATES PATENTS

| | | |
|---|---|---|
| 1,922,673 | Filippo | Aug. 15, 1933 |
| 2,807,350 | Rayburn | Sept. 24, 1957 |
| 2,905,744 | Rayburn et al. | Sept. 22, 1959 |
| 2,914,161 | Black | Nov. 24, 1959 |

OTHER REFERENCES

Publication, R. J. Roman, "Modular Bundles Use Etched-Wiring Boards," Electronics, December 1955, page 230.